United States Patent
Ishizuka et al.

(10) Patent No.: US 8,202,787 B2
(45) Date of Patent: Jun. 19, 2012

(54) METHOD FOR MANUFACTURING SOI WAFER

(75) Inventors: Tohru Ishizuka, Annaka (JP); Norihiro Kobayashi, Annaka (JP); Hiroji Aga, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/129,538

(22) PCT Filed: Nov. 11, 2009

(86) PCT No.: PCT/JP2009/006007
§ 371 (c)(1),
(2), (4) Date: May 16, 2011

(87) PCT Pub. No.: WO2010/067516
PCT Pub. Date: Jun. 17, 2010

(65) Prior Publication Data
US 2011/0223740 A1  Sep. 15, 2011

(30) Foreign Application Priority Data
Dec. 11, 2008  (JP) .................. 2008-315930

(51) Int. Cl.
*H01L 21/30* (2006.01)
(52) U.S. Cl. ............... 438/458; 257/E21.568
(58) Field of Classification Search .......... 438/458; 257/E21.339
See application file for complete search history.

(56) References Cited

U.S. PATENT DOCUMENTS

| | | | |
|---|---|---|---|
| 6,140,210 A * | 10/2000 | Aga et al. ............ | 438/458 |
| 6,534,380 B1 * | 3/2003 | Yamauchi et al. ...... | 438/455 |
| 2005/0118789 A1 | 6/2005 | Aga et al. | |
| 2006/0154442 A1 | 7/2006 | de Souza et al. | |
| 2008/0102603 A1 | 5/2008 | Kobayashi et al. | |

FOREIGN PATENT DOCUMENTS
EP  1 635 396 A1  3/2006
(Continued)

OTHER PUBLICATIONS
International Search Report issued in Application No. PCT/JP2009/006007; Dated Feb. 16, 2010.
Mar. 26, 2012 Search Report issued in European patent application No. 09831624.3.

*Primary Examiner* — Chandra Chaudhari
(74) *Attorney, Agent, or Firm* — Oliff & Berridge, PLC

(57) ABSTRACT

A method for manufacturing an SOI wafer having a buried oxide film with a predetermined thickness including performing a heat treatment for reducing a thickness of the buried oxide film on an SOI wafer material having an SOI layer formed on the buried oxide film, wherein a thickness of the SOI layer of the SOI wafer material to be subjected to the heat treatment for reducing the thickness of the buried oxide film is calculated on the basis of a ratio of the thickness of the buried oxide film to be reduced by the heat treatment with respect to a permissible value of an amount of change in an in-plane range of the buried oxide film, the change being caused by the heat treatment, and the SOI wafer material obtained by thinning the thickness of the bond wafer so as to have the calculated thickness of the SOI layer is subjected to the heat treatment for reducing the thickness of the buried oxide film.

16 Claims, 1 Drawing Sheet

FOREIGN PATENT DOCUMENTS

| | | |
|---|---|---|
| JP | A-10-242154 | 9/1998 |
| JP | A-2000-036445 | 2/2000 |
| JP | A-2004-031715 | 1/2004 |
| JP | A-2004-221198 | 8/2004 |
| JP | A-2006-156770 | 6/2006 |

* cited by examiner

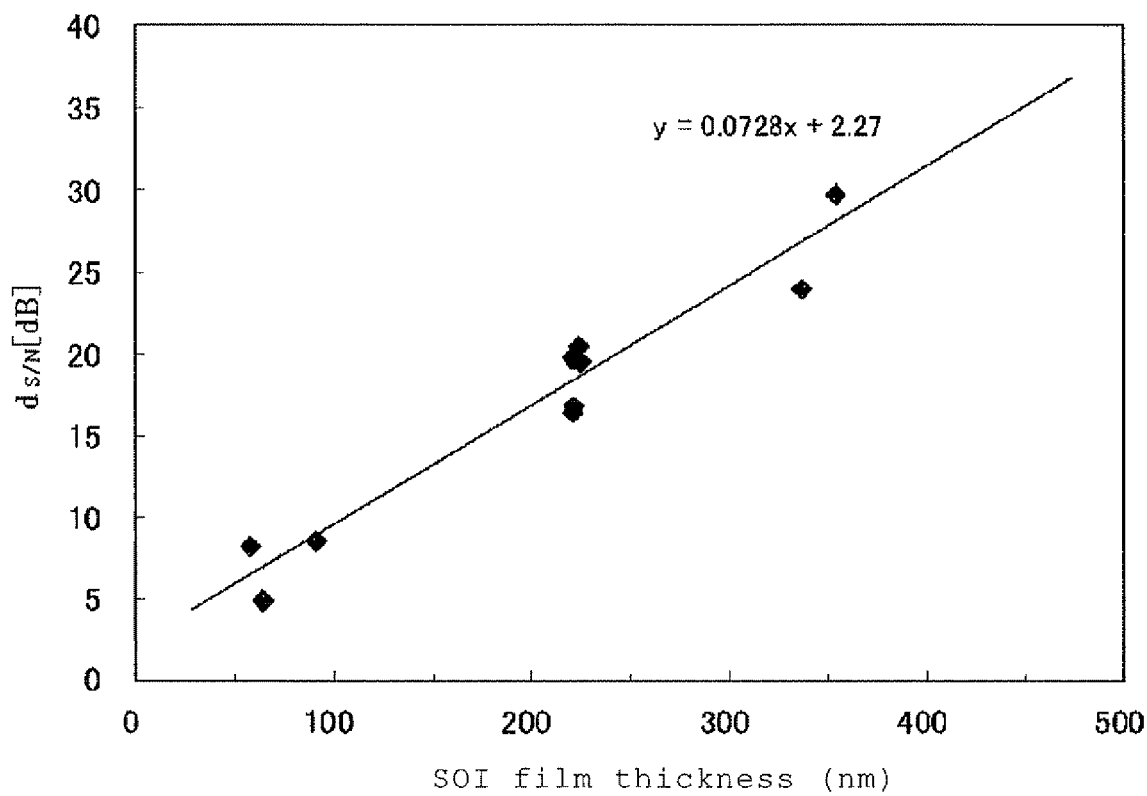

METHOD FOR MANUFACTURING SOI WAFER

TECHNICAL FIELD

The present invention relates to a method for manufacturing an SOI wafer having a SOI (Silicon On Insulator) structure in which a silicon single crystal layer is formed on an insulator.

BACKGROUND ART

As the generation of devices advances, the goal of a higher performance trend cannot be achieved only by a scaling effect with a conventional bulk silicon wafer, and a new device structure is accordingly needed. An SOI wafer has been paid attention to as a starting raw material. Furthermore, since the types of devices using the SOI wafer increase, thicknesses of buried oxide films in addition to SOI layers are demanded in a wide range.

As a typical manufacturing method of this SOI wafer, there are known, for example, a bonding method or a SIMOX method in which high concentration oxygen ions are implanted into a silicon wafer and thereafter a heat treatment is performed at a high temperature to form an oxide film inside the wafer. The bonding method is a method for manufacturing the SOI wafer having the SOI layer formed on a buried oxide film as an insulator by means of: forming an oxide film on at least one of a bond wafer on which the SOI layer is to be formed and a base wafer that is to be a supporting substrate; bonding the bond wafer to the base wafer through the oxide film; and thinning the thickness of the bond wafer.

From the viewpoint of being capable of manufacturing the SOI layer with a uniform thickness in a wide thickness range in case of the fabrication of a thin SOI layer, the SOI wafer has been mainly used which is manufactured by using an ion implantation delamination method (also called as the Smart Cut method (registered trademark)), which is one of the bonding method, among these manufacturing methods of the SOI wafer using the bonding method.

In the ion implantation delamination method, the buried oxide film is generally formed by growing an oxide film on the wafer prior to the bonding. The thickness of the buried oxide film of the SOI wafer can be controlled by controlling the thickness of the oxide film during the oxide film growth prior to the bonding. The control range can be wide. In case of a thin thickness of the buried oxide film, however, it is apt to become difficult to bond the wafers. Therefore, there arise problems that it is easy to generate defects called voids or blisters to the SOI wafer, and further the wafers are not bonded so that the SOI layer is not formed.

For the purpose of adjustments of the thickness of the SOI layer and a surface state thereof, various heat treatments may be performed after forming the SOI layer by delamination at an ion implanted layer. In this case, it is known that the thickness of the buried oxide film in addition to the thickness of the SOI layer at the surface change, and it is necessary to control the thickness of the buried oxide film also during heat treatment processes in the manufacture of the SOI wafer. This means that the thickness of the buried oxide film can be actively adjusted by the control during the heat treatment processes in the manufacture of the SOI wafer.

The methods in Patent Literature 1 and Patent Literature 2 are known as an adjustment method of the thickness of the buried oxide film by a heat treatment for reducing the thickness of the buried oxide film in the manufacture of the SOI wafer.

As described in Patent Literature 1 and Patent Literature 2, a method for manufacturing a SOI wafer having few defects was developed in which the wafers are bonded in such a manner that the thickness of the buried oxide film is thicker than a final target thickness, and thereafter the thickness is reduced during a heat treatment process in the manufacture of the SOI wafer. In this method, however, in-plane uniformity for a decrease in the thickness of the buried oxide film deteriorates due to nonuniformity of a gas used in the heat treatment, a heat treatment temperature, or the like. As a result, there arises a problem that in-plane distribution of the buried oxide film consequently deteriorates.

Citation List

Patent Literature

Patent Literature 1:Japanese Unexamined Patent publication (Kokai) No.2004-221198

Patent Literature 2:Japanese Unexamined Patent publication (Kokai) No.2006-156770

SUMMARY OF INVENTION

The present invention was accomplished in view of the above-explained circumstances, and its object is to manufacture an SOI wafer superior in thickness uniformity of the buried oxide film by controlling within a predetermined range the deterioration of the in-plane distribution of the buried oxide film, which is caused by nonuniformity of the heat treatment temperature or the like during the heat treatment for reducing the thickness of the buried oxide film, in the method for manufacturing an SOI wafer by performing the heat treatment for reducing the thickness of the buried oxide film on an SOI wafer material having the SOI layer formed on the buried oxide film.

To achieve this object, the present invention provides a method for manufacturing an SOI wafer having a buried oxide film with a predetermined thickness by means of: forming an oxide film on a surface of at least one of a bond wafer and a base wafer; bonding the bond wafer to the base wafer through the formed oxide film; and performing a heat treatment for reducing a thickness of the buried oxide film on an SOI wafer material having an SOI layer formed on the buried oxide film, the SOI wafer material being obtained by thinning a thickness of the bond wafer after the bonding, wherein a thickness of the SOI layer of the SOI wafer material to be subjected to the heat treatment for reducing the thickness of the buried oxide film is calculated on the basis of a ratio of the thickness of the buried oxide film to be reduced by the heat treatment with respect to a permissible value of an amount of change in an in-plane range of the buried oxide film, the change being caused by the heat treatment, and the SOI wafer material obtained by thinning the thickness of the bond wafer so as to have the calculated thickness of the SOI layer is subjected to the heat treatment for reducing the thickness of the buried oxide film.

In this manner, when the thickness of the SOI layer of the SOI wafer material to be subjected to the heat treatment for reducing the thickness of the buried oxide film is calculated on the basis of a ratio of the thickness of the buried oxide film to be reduced by the heat treatment with respect to a permissible value of an amount of change in an in-plane range (a value obtained by subtracting the minimum thickness from the maximum thickness of the buried oxide film) of the buried oxide film, the change being caused by the heat treatment, and the SOI wafer material obtained by thinning the thickness of the bond wafer so as to have the calculated thickness of the SOI layer is subjected to the heat treatment for reducing the thickness of the buried oxide film, the in-plane range of the buried oxide film thinned to a desired thickness by the heat treatment can be controlled within a desired range, and an SOI wafer superior in thickness uniformity of the buried oxide film can be finally manufactured.

Moreover, the thickness of the buried oxide film to be reduced by the heat treatment is preferably 40 nm or less in the calculation of the thickness of the SOI layer of the SOI wafer material.

The reduction of a thickness of more than 40 nm impractically requires a high temperature heat treatment for a long time or an extremely thin thickness of the SOI layer at the heat treatment, and the thickness of 40 nm or less of the buried oxide film to be reduced is therefore preferable.

Moreover, the predetermined thickness of the buried oxide film can be 30 nm or less.

In this manner, the method for manufacturing an SOI wafer according to the present invention is preferably applied to the case of manufacturing the SOI wafer having the buried oxide film with a thickness of 30 nm or less, and can manufacture the SOI wafer superior in thickness uniformity of the buried oxide film.

Moreover, the heat treatment for reducing the thickness of the buried oxide film is preferably performed at a temperature of 1000° C. or more under an atmosphere of a hydrogen gas, an argon gas, or a mixed gas thereof.

In this manner, the heat treatment for reducing the thickness of the buried oxide film can be performed at a temperature of 1000° C. or more under an atmosphere of a hydrogen gas, an argon gas, or a mixed gas thereof.

Moreover, the SOI wafer material can be fabricated by an ion implantation delamination method.

In this manner, when the bond wafer is thinned by using the ion implantation delamination method to fabricate the SOI wafer material, the SOI layer superior in thickness uniformity can be formed.

With the method for manufacturing an SOI wafer according to the present invention, the in-plane range of the buried oxide film thinned to a predetermined thickness by the heat treatment can be controlled within a desired range, and the SOI wafer superior in thickness uniformity of the buried oxide film can be finally manufactured.

BRIEF DESCRIPTION OF THE DRAWINGS

FIG. 1 is a view showing a correlative relationship between the thickness of the SOI layer and $d_{S/N}$ [dB].

DESCRIPTION OF EMBODIMENTS

Hereinafter, the present invention will be explained in detail.

As described above, conventionally used is a method for manufacturing the SOI wafer having few defects, such as voids and blisters, by forming an oxide film on the surface of at least one of the bond wafer and the base wafer and bonding the bond wafer to the base wafer in such a manner that the thickness of the buried oxide film is thicker than a final target thickness; and thereafter performing the heat treatment for reducing the thickness of the buried oxide film on the SOI wafer material obtained by thinning the thickness of the bond wafer. In this method, however, there arises the problem that the in-plane distribution of the buried oxide film consequently deteriorates due to nonuniformity of the heat treatment temperature or the like in a plane during the heat treatment for reducing the thickness of the buried oxide film.

According to Japanese Unexamined Patent publication (Kokai) No.2004-221198, it has been known that the reduction amount of the thickness of the buried oxide film by the heat treatment depends on the SOI layer at the surface when the heat treatment for reducing the thickness of the buried oxide film is performed.

Moreover, the present inventors have keenly conducted studies and thereby found that the deterioration of in-plane distribution of the buries oxide film also changes depending on the thickness of the SOI layer at the surface. In addition, the present inventors have found that when the thickness of the SOI layer of the SOI wafer material is calculated on the basis of a ratio of the thickness of the buried oxide film to be reduced by the heat treatment with respect to a permissible value of the amount of change in the in-plane range of the thickness of the buried oxide film, the change (deterioration) being caused by the heat treatment, and the SOI wafer material obtained by thinning the bond wafer so as to have the calculated thickness of the SOI layer is subjected to the heat treatment for reducing the thickness of the buried oxide film, the change (deterioration) amount of the in-plane range of the buried oxide film generated by the heat treatment can be adjusted within a desired range, and brought the present invention to completion.

It is to be noted that a final thickness of the SOI layer is fundamentally determined by request specifications applied to the purpose of a user who uses the SOI wafer. The SOI layer thickness (the thickness of the SOI layer of the SOI wafer material) itself in the process for reducing the thickness of the buried oxide film during the manufacturing process of the SOI wafer has room to be determined according to maker's discretion when each condition of the manufacturing process of the SOI wafer is set. The thickness of the SOI layer in the process for reducing the thickness of the buried oxide film can be adjusted so as to satisfy the request specifications in a subsequent process, and the degree-of-freedom of the determination of the final thickness requested by the user is not affected at all.

Hereinafter, the method for manufacturing an SOI wafer according to the present invention will be explained in detail, but the present invention is not restricted thereto.

First, in order to determine the thickness of the SOI layer of the SOI wafer material to be subjected to the heat treatment for reducing the thickness of the buried oxide film, the relationship between the thickness of the SOI layer and the ratio of the thickness of the buried oxide film to be reduced by the heat treatment with respect to the amount of change in the in-plane range of the buried oxide film, caused by the heat treatment are calculated.

Hereinafter, there is shown an example to obtain the relationship between the thickness of the SOI layer and the ratio of the thickness of the buried oxide film to be reduced by the heat treatment with respect to the amount of change in the in-plane range of the buried oxide film, caused by the heat treatment.

The SOI wafer materials (materials for carrying out a process of reducing the thickness of the buried oxide film (BOX) by the heat treatment) are fabricated in various conditions by the ion implantation delamination method (implanted ions: hydrogen ions of $8 \times 10^{16}/cm^2$) with mirror-polished wafers (a crystal orientation of <100>) made of a silicon single crystal having a diameter of 300 mm. The materials are subjected to the heat treatment at 1200° C. under a 100% argon atmosphere to reduce the thickness of the BOX (the buried oxide film), and thereby 11 SOI wafers are manufactured.

Table 1 shows an SOI film thickness, BOX thicknesses and BOX thickness ranges between before and after the heat treatment for reducing the thickness of the buried oxide film, the amount of reduction in the BOX thickness (S), and the amount of change in the BOX thickness range (N), which are measured values in each sample.

It is to be noted that the SOI film thickness and the BOX thickness are an average value in a plane and the BOX thickness range means the difference between the maximum value and minimum value of the thickness in a plane.

Moreover, Table 1 shows the result of $d_{S/N}$ [dB] calculated from the ratio (S/N) of the amount of reduction of the BOX thickness (S) with respect to the amount of change of the BOX thickness range (N) by using the following formula 1. FIG. 1 shows the relationship between $d_{S/N}$ [dB] and the SOI film thickness.

$$d_{S/N}[dB]=20\times \log(S/N) \quad \text{(formula 1)}$$

TABLE 1

| | THICKNESS OF SOI LAYER (nm) | BEFORE Ar HEAT TREATMENT | | AFTER Ar HEAT TREATMENT | | REDUCTION AMOUNT OF BOX THICKNESS S (nm) | CHANGE AMOUNT OF RANGE N (nm) | S/N | $d_{S/N}$ [dB] |
|---|---|---|---|---|---|---|---|---|---|
| | | BOX THICKNESS (nm) | RANGE (nm) | BOX THICKNESS (nm) | RANGE (nm) | | | | |
| SAMPLE 1 | 353.9 | 21.3 | 0.24 | 16.0 | 0.41 | 5.3 | 0.17 | 30.5 | 29.7 |
| SAMPLE 2 | 336.8 | 31.4 | 0.13 | 26.0 | 0.47 | 5.3 | 0.34 | 15.8 | 24.0 |
| SAMPLE 3 | 221.4 | 33.0 | 0.10 | 21.8 | 1.71 | 11.2 | 1.61 | 6.9 | 16.8 |
| SAMPLE 4 | 224.9 | 31.4 | 0.17 | 20.2 | 1.35 | 11.2 | 1.18 | 9.5 | 19.5 |
| SAMPLE 5 | 221.0 | 33.1 | 0.08 | 21.8 | 1.79 | 11.3 | 1.71 | 6.6 | 16.4 |
| SAMPLE 6 | 220.5 | 31.6 | 0.12 | 20.1 | 1.30 | 11.5 | 1.19 | 9.7 | 19.7 |
| SAMPLE 7 | 221.8 | 31.6 | 0.23 | 19.9 | 1.44 | 11.7 | 1.22 | 9.6 | 19.7 |
| SAMPLE 8 | 223.9 | 28.0 | 0.16 | 16.2 | 1.27 | 11.8 | 1.11 | 10.6 | 20.5 |
| SAMPLE 9 | 91.3 | 143.5 | 1.45 | 126.2 | 7.94 | 17.3 | 6.49 | 2.66 | 8.50 |
| SAMPLE 10 | 57.8 | 147.1 | 1.52 | 123.7 | 10.65 | 23.5 | 9.13 | 2.57 | 8.20 |
| SAMPLE 11 | 64.3 | 143.5 | 1.71 | 119.3 | 15.52 | 24.2 | 13.80 | 1.75 | 4.87 |

As shown in FIG. 1, it is revealed that there is a proportional relationship between $d_{S/N}$ [dB] and the SOI film thickness (T) (an approximate formula of a line is presented by $d_{S/N}$ [dB]=0.0728T+2.27).

The present invention utilizes the above-described correlative relationship between the thickness of the SOI layer (the SOI film thickness T) of the SOI wafer material to be subjected to the heat treatment for reducing the thickness of the buried oxide film and $d_{S/N}$ [dB] calculated from the ratio of the thickness of the buried oxide film to be reduced by the heat treatment (the amount of reduction of the BOX thickness (S)) with respect to the amount of change in the in-plane range (N) of the buried oxide film, caused by the heat treatment.

Hereinafter, the method for manufacturing according to the present invention after the correlative relationship between $d_{S/N}$ [dB] and the thickness (T) of the SOI layer is obtained will be explained in more detail. The case of the manufacture of the SOI wafer by using the ion implantation delamination method will be explained as a preferred embodiment of the method for manufacturing according to the present invention.

First, two mirror-polished wafers made of a silicon single crystal are prepared. One of the two silicon wafers is the base wafer, which is to be a supporting wafer adapted to the device specifications, and the other is the bond wafer, which is to be the SOI layer. Next, an oxide film is formed on the surface of at least one of the wafers. Hydrogen ions are thereafter implanted into a surface portion of the bond wafer to form an ion implanted layer parallel to the wafer surface at an average penetration depth of ions. In this case, ions to be implanted into the bond wafer may be rare gas ions.

After the ion implanted layer is formed to the bond wafer, the hydrogen-ion implanted surface of the bond wafer is brought into close contact with the base wafer through the oxide film. In this case, the wafers can be bonded without an adhesive and the like, for example, by bringing the surface of the two wafers into close contact with one another at a room temperature under a clean atmosphere.

After the wafers are bonded, the bond wafer is thinned to form the SOI layer. The thinning of the bond wafer is carried out, for example, by performing a delamination heat treatment at a temperature of approximately 500° C. under an inert gas atmosphere to delaminate the bond wafer at the ion implanted layer formed to the bond wafer by the above-described hydrogen ion implantation as a boundary so that the SOI wafer material can be readily fabricated. In this fabrication of the SOI wafer material, the thickness of the bond wafer is thinned so that the thickness of the SOI layer becomes equal to the thickness calculated on the basis of the ratio of the thickness of the buried oxide film to be reduced by the subsequent heat treatment with respect to a permissible value of the amount of change in the in-plane range of the buried oxide film, caused by the heat treatment. It is to be noted that, in the thinning of the bond wafer, sacrificial oxidation treatment may be performed to remove a damaged layer on a delaminating plane and to enhance bonding strength.

Moreover, the thinning of the bond wafer can be also carried out by grinding, polishing, etching or the like.

Next, the SOI wafer material having the SOI layer with a set thickness is subjected to the heat treatment for reducing the thickness of the buried oxide film. The thickness of the SOI layer is thereafter adjusted to the thickness of the SOI layer adapted to the request specifications by the sacrificial oxidation treatment, vapor etching, or the like.

When the thickness of the SOI layer of the SOI wafer material is set as described above, the in-plane range of the buried oxide film thinned to a desired thickness can be controlled within a desired range, and the SOI wafer superior in thickness uniformity of the buried oxide film can be finally manufactured.

Hereinafter, a method for setting the thickness of the SOI layer of the SOI wafer material will be described in more detail.

The method for manufacturing an SOI wafer according to the present invention is preferably used mainly for the manufacture of an SOI wafer product having the buried oxide film with a final thickness of 100 nm or less. As described in Japanese Unexamined Patent publication (Kokai) No.2004-

221198, when an SOI wafer having the buried oxide film with a thickness of 100 nm or less is manufactured by controlling the thickness of the buried oxide film prior to the bonding, a lot of bonding defects called voids and blisters are generated, and production yield is extremely lowered. Performing a plasma treatment on the bonded surfaces enables the enhancement of the bonding strength at a room temperature and thereby the bonding without the generation of the voids and blisters, even when the thickness of the buried oxide film is 100 nm or less. But even so, the minimum thickness is approximately 30 nm. The method of thinning the thickness of the buried oxide film by performing a high temperature heat treatment on the SOI wafer material, like the present invention, is therefore useful for the manufacture of the SOI wafer having the buried oxide film with this minimum thickness or less at high yield.

Hereinafter, an example of a final SOI wafer product having the buried oxide film with a thickness of 10 nm will be explained. When the in-plane uniformity required for the case of the buried oxide film having a thickness of 10 nm is ±5%, a permissible in-plane range thereof is 1 nm. Considering a variation between wafer products, the in-plane range is preferably controlled to 0.5 nm, which is half of that.

On the other hand, performing the plasma treatment on the bonded surfaces enables the thickness of the buried oxide film of the SOI wafer material to thin up to approximately 30 nm. In this case, an oxide film of 30 nm is formed on at least one of the wafers before the wafers are bonded, and the in-plane range of the formed oxide film is at least approximately 0.15 nm at present. When the heat treatment is performed on the SOI wafer material having the buried oxide film with a thickness of 30 nm to thin by 20 nm, the amount of change N in the permissible in-plane range is therefore 0.35 nm (=0.5 nm−0.15 nm).

That is, $d_{S/N}$ [dB]=20×log(20/0.35)=35 dB is calculated from S=20 nm, and N=0.35 nm. When this value is applied to the approximate line in FIG. 1, the SOI film thickness is calculated at approximately 450 nm. The SOI wafer material is accordingly manufactured so that the SOI film thickness (the thickness of the SOI layer at the time of performing the heat treatment for reducing the thickness of the buried oxide film) of the SOI wafer material becomes 450 nm.

As described above, the thickness of the SOI layer of the SOI layer material can be set by utilizing the correlative relationship between the thickness of the SOI layer and $d_{S/N}$ [dB] obtained in advance. Moreover, the thickness of the buried oxide film to be reduced by the heat treatment S is preferably 40 nm or less.

The reduction of a thickness of more than 40 nm impractically requires a high temperature heat treatment for a long time or an extremely thin thickness of the SOI layer at the heat treatment.

As described above, when the thickness of the SOI layer of the SOI wafer material to be subjected to the heat treatment for reducing the thickness of the buried oxide film is calculated on the basis of the ratio of the thickness of the buried oxide film to be reduced by the heat treatment with respect to a permissible value of the amount of change in the in-plane range of the buried oxide film, caused by the heat treatment, and the SOI wafer material obtained by thinning the thickness of the bond wafer so as to have the calculated thickness of the SOI layer is subjected to the heat treatment for reducing the thickness of the buried oxide film, the in-plane range of the buried oxide film can be controlled within a desired range, and the SOI wafer superior in thickness uniformity of the buried oxide film can be finally manufactured.

EXAMPLE

Hereinafter, the present invention will be explained in more detail with reference to Example and Comparative Example, but the present invention is not restricted thereto.

Example

Manufacture of an SOI Wafer Having an SOI Layer of 50 nm and a BOX of 25 nm (Setting Conditions)

The thickness of the buried oxide film to be reduced by the heat treatment (S) and the permissible value of the amount of change in the in-plane range (N) of the buried oxide film, caused by the heat treatment, were determined, and $d_{S/N}$ [dB] was calculated, as below.

Thickness of the buried oxide film to be reduced by the heat treatment (S): 10 nm Permissible value of the amount of change in the in-plane range (N) of the buried oxide film caused by the heat treatment: 0.8 nm $$d_{S/N} [dB]=20 \times \log(10/0.8)=22 \text{ dB}$$

The SOI film thickness of the SOI wafer material was set to 270 nm by using the appropriate line in FIG. 1.

(Fabrication of the SOI wafer material)

A thermal oxide film of 35 nm (an in-plane range of 0.2 nm) was formed on one of silicon single crystal wafers (the bond wafer). Hydrogen ions were implanted into the bond wafer through the oxide film. The other silicon single crystal wafer (the base wafer) was subjected to a nitrogen plasma treatment (treatment conditions: a room temperature, a gas flow rate of 115 sccm, a pressure of 0.4 Torr (53.3 Pa), an output of 100 W, 15 seconds), and bonded to the bond wafer at a room temperature. The bond wafer was delaminated at the ion implanted layer by performing a heat treatment at a temperature of 500° C. for 30 minutes.

The SOI film thickness of the delaminated wafer was 300 nm, and the thickness of the buried oxide film was 35 nm.

The treatment (the sacrificial oxidation treatment) for forming a thermal oxide film on the surface of the SOI layer by performing a heat treatment at a temperature of 900° C. under an oxidizing atmosphere to remove a damaged layer on the delaminating plane and to enhance the bonding strength and removing the formed thermal oxide film by an HF aqueous solution was thereafter performed to fabricate the SOI wafer material having a SOI film thickness of 270 nm and a buried oxide film thickness of 35 nm.

(Treatment for Reducing the Thickness of the Buried Oxide Film)

The heat treatment for reducing was performed on the above-fabricated SOI wafer material at a temperature of 1200° C. under a 100% argon atmosphere for 2 hours. The thickness of the buried oxide film was 25.2 nm and the in-plane range was 0.95 nm after the heat treatment.

(Adjustment of the SOI Film Thickness)

A thermal oxide film of 490 nm was formed on the surface of the SOI layer by pyrogenic oxidation at a temperature of 1000° C., and thereafter the oxide film was removed by an HF aqueous solution to adjust the SOI film thickness to 50 nm.

Comparative Example

Manufacture of an SOI Wafer Having an SOI Layer of 50 nm and a BOX of 25 nm (Fabrication of the SOI Wafer Material)

A thermal oxide film of 35 nm (an in-plane range of 0.2 nm) was formed on one of silicon single crystal wafers (the bond wafer). Hydrogen ions were implanted into the bond wafer through the oxide film. The other silicon single crystal wafer (the base wafer) was subjected to a nitrogen plasma treatment (treatment conditions: a room temperature, a gas flow rate of 115 sccm, a pressure of 0.4 Torr (53.3 Pa), an output of 100 W, 15 seconds), and bonded to the bond wafer at a room temperature. The bond wafer was delaminated at the ion implanted layer by performing a heat treatment at a temperature of 500° C. for 30 minutes.

The SOI film thickness of the delaminated wafer was 140 nm, and the thickness of the buried oxide film was 35 nm. The treatment (the sacrificial oxidation treatment) for forming a thermal oxide film on the surface of the SOI layer by performing a heat treatment at a temperature of 900° C. under an oxidizing atmosphere to remove a damaged layer on the delaminating plane and to enhance the bonding strength and removing the formed thermal oxide film by an HF aqueous solution was thereafter performed to fabricate the SOI wafer material having a SOI film thickness of 100 nm and a buried oxide film thickness of 35 nm.

(Treatment for Reducing the Thickness of the Buried Oxide Film)

The heat treatment for reducing was performed on the above-fabricated SOI wafer material at a temperature of 1200° C. under a 100% argon atmosphere for 1 hour. The thickness of the buried oxide film was 24.6 nm and the in-plane range was 3.5 nm after the heat treatment.

(Adjustment of the SOI Film Thickness)

A thermal oxide film of 110 nm was formed on the surface of the SOI layer by pyrogenic oxidation at a temperature of 1000° C., and thereafter the oxide film was removed by an HF aqueous solution to adjust the SOI film thickness to 50 nm.

As described above, in case of Example to which the present invention is applied, even when the heat treatment for reducing the thickness of the buries oxide film was performed to manufacture the SOI wafer that is to be a final product, the in-plane range of the buried oxide film was able to be suppressed within a target value (a value of product standards) of 1.0 nm.

On the other hand, in case of Comparative Example, the thickness of the SOI layer was set to be a relatively thin in order to facilitate the adjustment of the SOI film thickness by the sacrificial oxidation treatment in a subsequent process, without the application of the present invention in setting of the thickness of the SOI layer during the process for reducing the thickness of the buried oxide film. As a result, the in-plane range of the buried oxide film after the heat treatment was extremely deteriorated, and thereby it was not able to satisfy the value of product standards.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer having a buried oxide film with a predetermined thickness by means of: forming an oxide film on a surface of at least one of a bond wafer and a base wafer; bonding the bond wafer to the base wafer through the formed oxide film; and performing a heat treatment for reducing a thickness of the buried oxide film on an SOI wafer material having an SOI layer formed on the buried oxide film, the SOI wafer material being obtained by thinning a thickness of the bond wafer after the bonding, wherein a thickness of the SOI layer of the SOI wafer material to be subjected to the heat treatment for reducing the thickness of the buried oxide film is calculated on the basis of a ratio of the thickness of the buried oxide film to be reduced by the heat treatment with respect to a permissible value of an amount of change in an in-plane range of the buried oxide film, the change being caused by the heat treatment, and the SOI wafer material obtained by thinning the thickness of the bond wafer so as to have the calculated thickness of the SOI layer is subjected to the heat treatment for reducing the thickness of the buried oxide film.

2. The method for manufacturing an SOI wafer according to claim 1, wherein the thickness of the buried oxide film to be reduced by the heat treatment is 40 nm or less in the calculation of the thickness of the SOI layer of the SOI wafer material.

3. The method for manufacturing an SOI wafer according to claim 1, wherein the predetermined thickness of the buried oxide film is 30 nm or less.

4. The method for manufacturing an SOI wafer according to claim 2, wherein the predetermined thickness of the buried oxide film is 30 nm or less.

5. The method for manufacturing an SOI wafer according to claim 1, wherein the heat treatment for reducing the thickness of the buried oxide film is performed at a temperature of 1000° C. or more under an atmosphere of a hydrogen gas, an argon gas, or a mixed gas thereof.

6. The method for manufacturing an SOI wafer according to claim 2, wherein the heat treatment for reducing the thickness of the buried oxide film is performed at a temperature of 1000° C. or more under an atmosphere of a hydrogen gas, an argon gas, or a mixed gas thereof.

7. The method for manufacturing an SOI wafer according to claim 3, wherein the heat treatment for reducing the thickness of the buried oxide film is performed at a temperature of 1000° C. or more under an atmosphere of a hydrogen gas, an argon gas, or a mixed gas thereof.

8. The method for manufacturing an SOI wafer according to claim 4, wherein the heat treatment for reducing the thickness of the buried oxide film is performed at a temperature of 1000° C. or more under an atmosphere of a hydrogen gas, an argon gas, or a mixed gas thereof.

9. The method for manufacturing an SOI wafer according to claim 1, wherein the SOI wafer material is fabricated by an ion implantation delamination method.

10. The method for manufacturing an SOI wafer according to claim 2, wherein the SOI wafer material is fabricated by an ion implantation delamination method.

11. The method for manufacturing an SOI wafer according to claim 3, wherein the SOI wafer material is fabricated by an ion implantation delamination method.

12. The method for manufacturing an SOI wafer according to claim 4, wherein the SOI wafer material is fabricated by an ion implantation delamination method.

13. The method for manufacturing an SOI wafer according to claim 5, wherein the SOI wafer material is fabricated by an ion implantation delamination method.

14. The method for manufacturing an SOI wafer according to claim 6, wherein the SOI wafer material is fabricated by an ion implantation delamination method.

15. The method for manufacturing an SOI wafer according to claim 7, wherein the SOI wafer material is fabricated by an ion implantation delamination method.

16. The method for manufacturing an SOI wafer according to claim 8, wherein the SOI wafer material is fabricated by an ion implantation delamination method.

* * * * *